(12) United States Patent  
Takizawa et al.

(10) Patent No.: US 8,803,315 B2  
(45) Date of Patent: Aug. 12, 2014

(54) HIGH-FREQUENCY MODULE AND COMMUNICATION APPARATUS

(71) Applicant: Murata Manufacturing Co., Ltd., Kyoto-fu (JP)

(72) Inventors: Koichi Takizawa, Kyoto-fu (JP); Yoshihiko Goto, Kyoto-fu (JP); Kaoru Sudo, Kyoto-fu (JP); Hirotaka Fujii, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 13/753,370

(22) Filed: Jan. 29, 2013

(65) Prior Publication Data

US 2014/0138804 A1  May 22, 2014

Related U.S. Application Data

(63) Continuation of application No. PCT/JP2011/057643, filed on Mar. 28, 2011.

(30) Foreign Application Priority Data

Jul. 29, 2010 (JP) ................................. 2010-170322

(51) Int. Cl.  
*H01L 23/34* (2006.01)

(52) U.S. Cl.  
USPC .......................................... 257/728; 257/778

(58) Field of Classification Search  
USPC .................... 257/728, 778, 686, 777  
See application file for complete search history.

(56) References Cited

U.S. PATENT DOCUMENTS

| | | | | |
|---|---|---|---|---|
| 5,798,567 | A * | 8/1998 | Kelly et al. | 257/723 |
| 6,807,063 | B2 * | 10/2004 | Shimura et al. | 361/764 |
| 7,504,721 | B2 * | 3/2009 | Chen et al. | 257/724 |
| 7,656,030 | B2 | 2/2010 | Osone et al. | |
| 7,782,624 | B2 | 8/2010 | Fujii | |
| 2004/0034489 | A1 * | 2/2004 | Ogino et al. | 702/75 |
| 2005/0104685 | A1 * | 5/2005 | Kuroki et al. | 333/133 |
| 2010/0295151 | A1 | 11/2010 | Kurokawa | |
| 2011/0309893 | A1 | 12/2011 | Kawamura et al. | |

FOREIGN PATENT DOCUMENTS

| | | |
|---|---|---|
| JP | 2002-100698 A | 4/2002 |
| JP | 2007-188916 A | 7/2007 |
| JP | 2009-158742 A | 7/2009 |
| JP | 2010-109269 A | 5/2010 |
| WO | 2010/079663 A1 | 7/2010 |

OTHER PUBLICATIONS

International Search Report; PCT/JP2011/057643; Jun. 14, 2011.  
Written Opinion of the International Searching Authority; PCT/JP2011/057643; Jun. 14, 2011.

* cited by examiner

*Primary Examiner* — S. V. Clark  
(74) *Attorney, Agent, or Firm* — Studebaker & Brackett PC

(57) ABSTRACT

A semiconductor component is face-up mounted on a package substrate. An antenna substrate is flip-chip mounted on a front side of the semiconductor component. A device-side high-frequency signal terminal is disposed on the front side of the semiconductor component, and an antenna-side high-frequency signal terminal is disposed on a back side of the antenna substrate. The device-side high-frequency signal terminal and the antenna-side high-frequency signal terminal are electrically connected to each other. Thus, the antenna substrate for high-frequency signals can be separated from the package substrate for baseband signals.

15 Claims, 12 Drawing Sheets

HIGH-FREQUENCY MODULE AND COMMUNICATION APPARATUS

CROSS REFERENCE TO RELATED APPLICATIONS

The present application is a continuation of International Application No. PCT/2011/057463 filed on Mar. 28, 2011, and claims priority to Japanese Patent Application No. 2010-170322 filed on Jul. 29, 2010, the entire contents of each of these applications being incorporated herein by reference in their entirety.

TECHNICAL FIELD

The technical field relates to a high-frequency module that transmits or receives high-frequency signals using an antenna, and to a communication apparatus that includes the high-frequency module.

BACKGROUND

A high-frequency module is generally known in which a circuit board formed by a multilayer substrate includes a chip mounting portion for mounting a semiconductor chip for communication and is provided with external connection terminals. For example, see Japanese Unexamined Patent Application Publication No. 2002-100698 (Patent Document 1). Patent Document 1 discloses a configuration in which the circuit board includes a filter circuit layer as an internal layer for filtering high-frequency signals, and also includes an antenna on the front side thereof for transmitting or receiving high-frequency signals.

SUMMARY

The present disclosure provides a high-frequency module and a communication apparatus in which a substrate for high-frequency signals is separated from that for other signals to reduce the cost of manufacture.

In one aspect of the disclosure, a high-frequency module includes a package substrate formed of a dielectric material, the package substrate having substrate-side direct-current voltage terminals configured to output a direct-current voltage, substrate-side baseband signal terminals configured to input or output baseband signals, and external connection terminals for connection to an external circuit; a semiconductor component including a functional circuit unit having at least one of a function of modulating a baseband signal into a high-frequency signal and a function of demodulating a high-frequency signal into a baseband signal, device-side direct-current voltage terminals to which a direct-current voltage for driving is input, device-side baseband signal terminals configured to input or output baseband signals, and a device-side high-frequency signal terminal located on the same front side of the semiconductor component as the functional circuit unit and configured to input or output high-frequency signals; and an antenna substrate formed using a dielectric material, the antenna substrate having an antenna element on a front side thereof and an antenna-side high-frequency signal terminal on a back side thereof, the antenna-side high-frequency signal terminal being configured to input or output high-frequency signals. The semiconductor component is face-up mounted on the package substrate with a back side thereof facing the package substrate, and the device-side direct-current voltage terminals and the device-side baseband signal terminals are electrically connected to the substrate-side direct-current voltage terminals and the substrate-side baseband signal terminals, respectively. The antenna substrate is flip-chip mounted on the front side of the semiconductor component, and the antenna-side high-frequency signal terminal is electrically connected to the device-side high-frequency signal terminal on the front side of the semiconductor component.

In a more specific embodiment, the device-side direct-current voltage terminals and the device-side baseband signal terminals of the semiconductor component and the substrate-side direct-current voltage terminals and the substrate-side baseband signal terminals of the package substrate may be electrically connected to each other through bonding wires.

In another more specific embodiment, the semiconductor component may have vias extending from the front side where the functional circuit unit is located to the back side; the device-side direct-current voltage terminals and the device-side baseband signal terminals of the semiconductor component may be located on the back side of the semiconductor component and electrically connected through the vias to the functional circuit unit; and the device-side direct-current voltage terminals and the device-side baseband signal terminals of the semiconductor component and the substrate-side direct-current voltage terminals and the substrate-side baseband signal terminals of the package substrate may be electrically connected to each other through bumps.

In yet another more specific embodiment, the antenna substrate may include a passive circuit portion electrically connected between the antenna element and the antenna-side high-frequency signal terminal and configured to process high-frequency signals.

(5) In the present invention, the antenna element is configured to transmit or receive high-frequency signals in a microwave band or a millimeter wave band.

In the present invention, the antenna element is configured to transmit or receive high-frequency signals in a microwave band or a millimeter wave band. Therefore, as compared to the case where signals lower than these signals are used, high-frequency signals in a wider band can be used and the communication speed can be increased.

In still another more specific embodiment, the front side of the package substrate may be sealed with a resin material that covers the semiconductor component.

In another aspect of the disclosure, a communication apparatus may include any of the above high-frequency modules.

DETAILED DESCRIPTION

Figure 1:
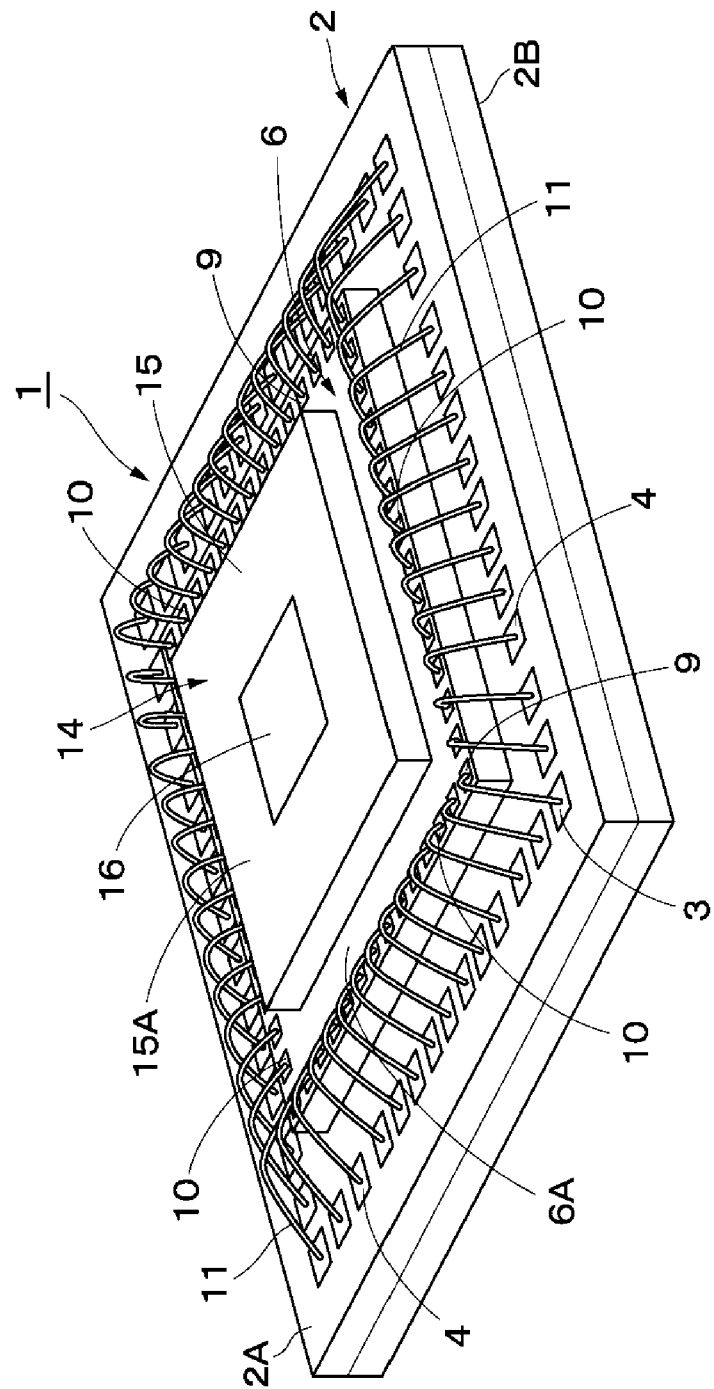
FIG. 1 is a perspective view of a high-frequency module according to a first exemplary embodiment.
Figure 2:
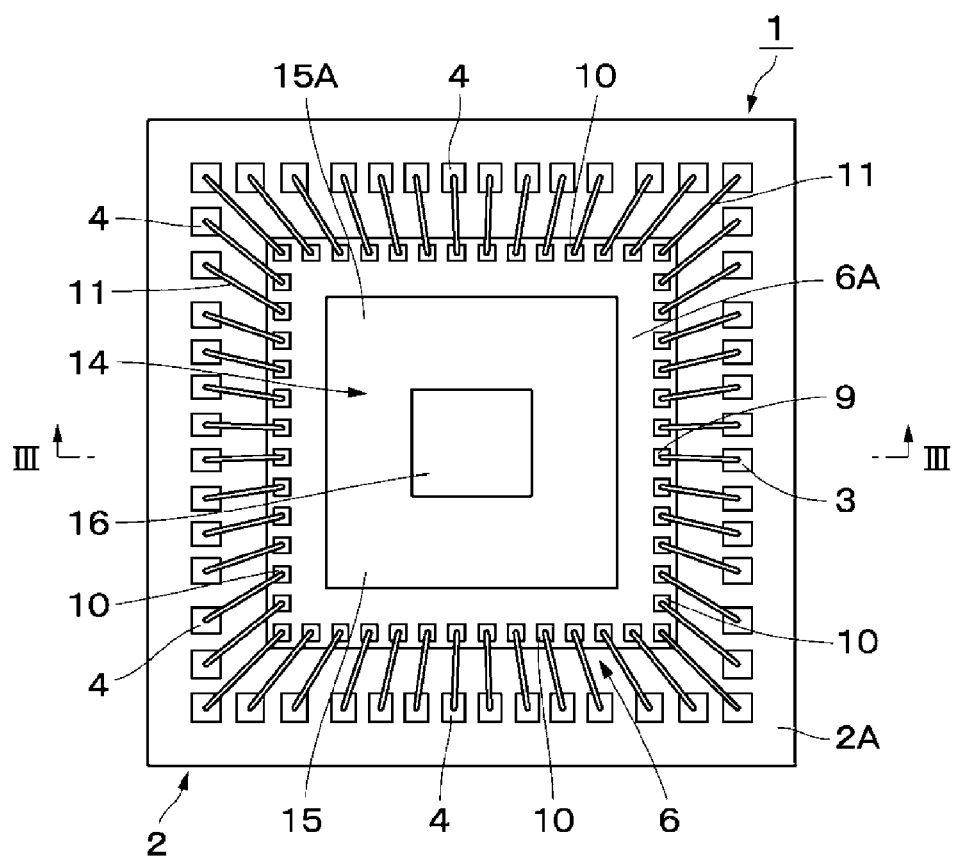
FIG. 2 is a plan view of the high-frequency module illustrated in FIG. 1.
Figure 3:
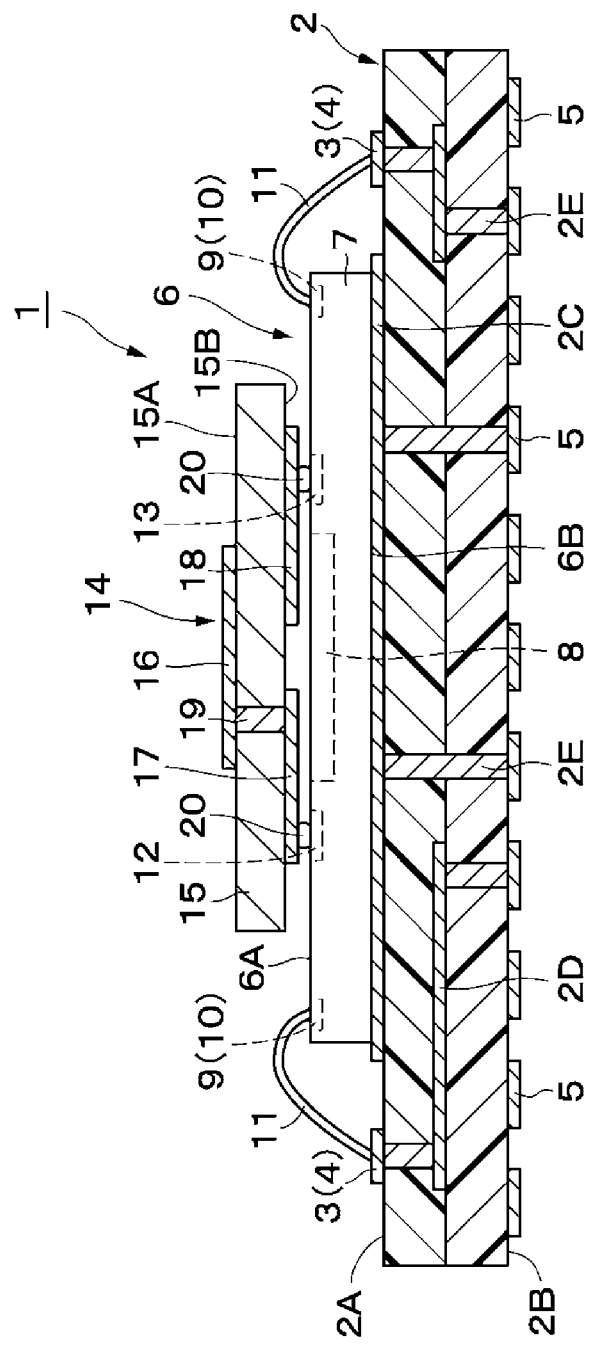
FIG. 3 is a cross-sectional view of the high-frequency module, as viewed in the direction of arrow III-III of FIG. 2.
Figure 4:
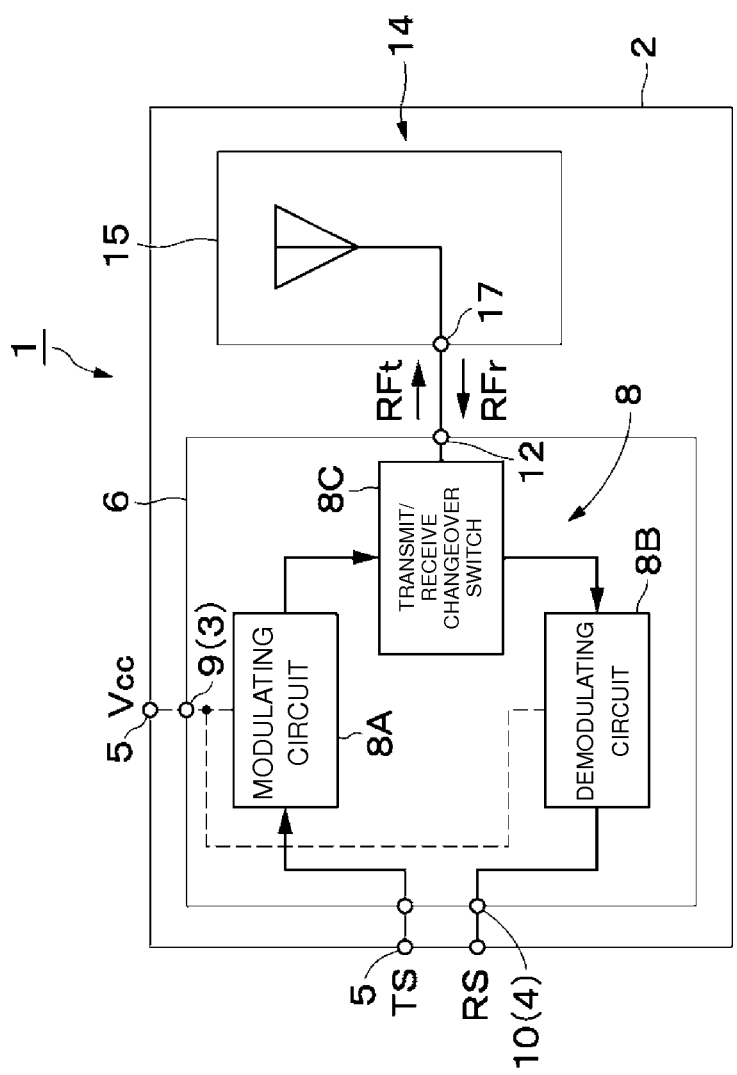
FIG. 4 is a block diagram of the high-frequency module illustrated in FIG. 1.

In the high-frequency module described in Patent Document 1, where the circuit board includes a filter and an antenna, it is necessary that the circuit board be made using a material with good high-frequency characteristics, such as a ceramic material having a high dielectric constant. The inventors recognized that such a material with good high-frequency characteristics is generally expensive. Further, the high-frequency module described in Patent Document 1 includes parts that do not necessarily require a material with good high-frequency characteristics, such as a part that supplies a direct-current voltage for driving a semiconductor component and a part that processes low-frequency signals. However, the high-frequency module described in Patent Document 1 needs to be made using the same material. This increases the cost involved in making the entire high-frequency module.

A high-frequency module and a communication apparatus including the high-frequency module that can address the above shortcomings according to exemplary embodiments will now be described in detail with reference to the attached drawings.

FIG. 1 to FIG. 4 illustrate a first exemplary embodiment of the present disclosure. As illustrated in the drawings, a high-frequency module 1 includes a package substrate 2, a semiconductor component 6, and an antenna 14 described below.

The package substrate 2 is formed, for example, using a multilayer substrate produced by stacking a plurality of insulating layers. The package substrate 2 is formed using a dielectric material, such as a resin material, into a substantially rectangular shape, and has a front side 2A and a back side 2B. The front side 2A of the package substrate 2 is provided with a mounting electrode 2C in the center thereof. The mounting electrode 2C provides a mounting area for mounting the semiconductor component 6. The mounting electrode 2C is surrounded by a plurality of substrate-side direct-current voltage terminals 3 and substrate-side baseband signal terminals 4. The substrate-side direct-current voltage terminals 3 output, for example, a drive voltage Vcc as a direct-current voltage for driving the semiconductor component 6. The substrate-side baseband signal terminals 4 input or output baseband signals TS and RS, which are low-frequency signals.

The baseband signals TS and RS may be any signals lower in frequency than high-frequency signals RFt and RFr described below. For example, the baseband signals TS and RS may be primary-modulated intermediate frequency signals (IF signals).

The package substrate 2 has a plurality of external connection terminals 5 on the back side 2B. The external connection terminals 5 are electrically connected, through a wiring pattern 2D and vias 2E inside the package substrate 2, to the mounting electrode 2C, the substrate-side direct-current voltage terminals 3, and the substrate-side baseband signal terminals 4. The wiring pattern 2D is formed, for example, by an electrode pattern interposed between insulating layers constituting the substrate 2. The vias 2E are produced, for example, by forming conductive metal films in small-diameter holes extending in the thickness direction of the insulating layers. The external connection terminals 5 are configured to electrically connect an external circuit to internal circuits of the package substrate 2 and the semiconductor component 6.

The semiconductor component 6 includes a main body 7 and a functional circuit unit 8 attached to and/or formed in the main body 7. The main body 7 is made of, for example, an insulating resin material, and the functional circuit unit 8 is configured to perform various functional processing. The semiconductor component 6 is formed into, for example, a substantially rectangular shape, and has a front side 6A and a back side 6B. The functional circuit unit 8 of the semiconductor component 6 is formed, for example, by an IC chip made using a semiconductor material, such as silicon. The functional circuit unit 8 is disposed on a side of the main body 7 adjacent to the front side 6A. The semiconductor component 6 is bonded on the back side 6B to the mounting electrode 2C of the package substrate 2, and is face-up mounted on the front side 2A of the package substrate 2, with the functional circuit unit 8 positioned opposite the package substrate 2.

The functional circuit unit 8 includes a modulating circuit 8A that modulates a baseband signal TS into a high-frequency signal RFt, and a demodulating circuit 8B that demodulates a high-frequency signal RFr into a baseband signal RS. The functional circuit unit 8 further includes a transmit/receive changeover switch 8C that connects one of the modulating circuit 8A and the demodulating circuit 8B to the antenna 14 described below. The transmit/receive changeover switch 8C changes the state of the high-frequency module 1 from transmitting mode to receiving mode and vice versa.

A plurality of device-side direct-current voltage terminals 9 and device-side baseband signal terminals 10 are disposed on the side of the main body 7 adjacent to the front side 6A. The device-side direct-current voltage terminals 9 and the device-side baseband signal terminals 10 are located at an outer edge of the front side 6A and electrically connected to the functional circuit unit 8. A direct-current voltage (e.g., drive voltage Vcc) for driving the functional circuit unit 8 of the semiconductor component 6 is supplied through the package substrate 2 to the device-side direct-current voltage terminals 9. In transmitting mode, a baseband signal TS is input from the package substrate 2 to the device-side baseband signal terminals 10, whereas in receiving mode, a baseband signal RS is output from the device-side baseband signal terminals 10 to the package substrate 2. The device-side direct-current voltage terminals 9 and the device-side baseband signal terminals 10 of the semiconductor component 6 are electrically connected through bonding wires 11 to the substrate-side direct-current voltage terminals 3 and the substrate-side baseband signal terminals 4 of the package substrate 2.

Additionally, a device-side high-frequency signal terminal 12 and a ground terminal 13 are disposed on the side of the main body 7 adjacent to the front side 6A. The device-side high-frequency signal terminal 12 and the ground terminal 13 are located closer to the center of the front side 6A than are the device-side direct-current voltage terminals 9 and the device-side baseband signal terminals 10 (i.e., located inside, or surrounded by the device-side direct-current voltage terminals 9 and the device-side baseband signal terminals 10). The device-side high-frequency signal terminal 12 is disposed to face the antenna 14 described below. High-frequency signals RFt and RFr are input or output between the device-side high-frequency signal terminal 12 and the antenna 14. The ground terminal 13 is connected through the semiconductor component 6 to an external ground.

The antenna 14 includes an antenna substrate 15 and an antenna element 16 formed, for example, by an electrode pattern on the antenna substrate 15. The antenna 14 forms a patch antenna. The antenna 14 transmits or receives high-frequency signals RFt and RFr, such as microwaves and millimeter waves, from the antenna element 16 serving as a radiating conductive element.

The antenna substrate 15 is formed, for example, using a dielectric material, such as a ceramic material having a desired dielectric constant, into a substantially rectangular shape. The antenna element 16 is disposed on a front side 15A of the antenna substrate 15, and an antenna-side high-frequency signal terminal 17 and a ground electrode 18 are disposed on a back side 15B of the antenna substrate 15. The ground electrode 18 is located at a position different from that of the antenna-side high-frequency signal terminal 17 and insulated from the antenna-side high-frequency signal terminal 17. The antenna-side high-frequency signal terminal 17 is connected, through a via 19 passing through the antenna substrate 15 in the thickness direction thereof, to the antenna element 16 and inputs or outputs high-frequency signals RFt and RFr.

The antenna substrate 15 is flip-chip mounted on the front side 6A of the semiconductor component 6, with the antenna-side high-frequency signal terminal 17 and the device-side high-frequency signal terminal 12 facing each other. The antenna-side high-frequency signal terminal 17 and the device-side high-frequency signal terminal 12 are electrically connected to each other through a bump 20, and the ground electrode 18 and the ground terminal 13 are electrically connected to each other through another bump 20. These bumps 20 are attached in advance to the antenna-side high-frequency signal terminal 17 and the ground electrode 18 using a conductive metal material, such as solder. The bumps 20 are then bonded to the corresponding device-side high-frequency signal terminal 12 and ground terminal 13 by a heating process in a reflow oven.

The high-frequency module 1 of the present exemplary embodiment has the configuration described above. An operation of the high-frequency module 1 will now be described.

In transmission using the high-frequency module 1, a baseband signal TS is supplied through the external connection terminals 5 to the semiconductor component 6. The modulating circuit 8A of the semiconductor component 6 modulates the baseband signal TS into a high-frequency signal RFt, and supplies the high-frequency signal RFt through the transmit/receive changeover switch 8C to the antenna 14, which radiates the high-frequency signal RFt into outer space.

In reception using the high-frequency module 1, a high-frequency signal RFr received from the antenna 14 is input through the transmit/receive changeover switch 8C to the demodulating circuit 8B of the semiconductor component 6. The demodulating circuit 8B demodulates the high-frequency signal RFr into a baseband signal RS, and outputs the baseband signal RS through the external connection terminals 5 to an external circuit (not shown).

In the present embodiment, the antenna substrate 15 is provided separately from the package substrate 2 having the substrate-side direct-current voltage terminals 3, the substrate-side baseband signal terminals 4, and the external connection terminals 5. In this case, high-frequency signals RFt and RFr propagate only through the antenna substrate 15 and the semiconductor component 6, and do not propagate through the package substrate 2. Therefore, it is only necessary that the antenna substrate 15 be made using a material with good high-frequency characteristics for propagation of high-frequency signals RFt and RFr. Since the package substrate 2 can be made using an inexpensive resin material or the like, it is possible to reduce the cost of manufacturing the high-frequency module 1.

The semiconductor component 6 is face-up mounted on the package substrate 2, and the antenna substrate 15 is flip-chip mounted on the front side 6A of the semiconductor component 6. Therefore, for example, as compared to the case where the semiconductor component 6 and the antenna substrate 15 are electrically connected to each other through bonding wires, the line length of the connecting portions can be shortened. Since the length of transmission lines for high-frequency signals RFt and RFr between the semiconductor component 6 and the antenna substrate 15 can be minimized, it is possible to reduce the transmission loss of high-frequency signals RFt and RFr and suppress the entry of external noise into high-frequency signals RFt and RFr.

As described above, the antenna substrate 15 is flip-chip mounted on the front side 6A of the semiconductor component 6. Therefore, as compared to the case where the antenna substrate 15 and the semiconductor component 6 are separately mounted on the package substrate 2, it is possible to reduce the area of the package substrate 2 and the overall size of the high-frequency module 1.

The device-side direct-current voltage terminals 9 and the device-side baseband signal terminals 10 of the semiconductor component 6 and the substrate-side direct-current voltage terminals 3 and the substrate-side baseband signal terminals 4 of the package substrate 2 are electrically connected to each other through the bonding wires 11. Therefore, even when the functional circuit unit 8, the device-side direct-current voltage terminals 9, and the device-side baseband signal terminals 10 are disposed on the front side 6A of the semiconductor component 6, the device-side direct-current voltage terminals 9 and the device-side baseband signal terminals 10 can be easily connected to the substrate-side direct-current voltage terminals 3 and the substrate-side baseband signal terminals 4 of the package substrate 2, and the connecting state of each of the terminals 3, 4, 9, and 10 can be visually checked easily.

The antenna element 16 is configured to transmit or receive high-frequency signals RFt and RFr in a microwave band or a millimeter wave band. Therefore, as compared to the case where signals having lower frequency than these signals are used, high-frequency signals RFt and RFr in a wider band can be used and the communication speed can be increased.

Figure 5:
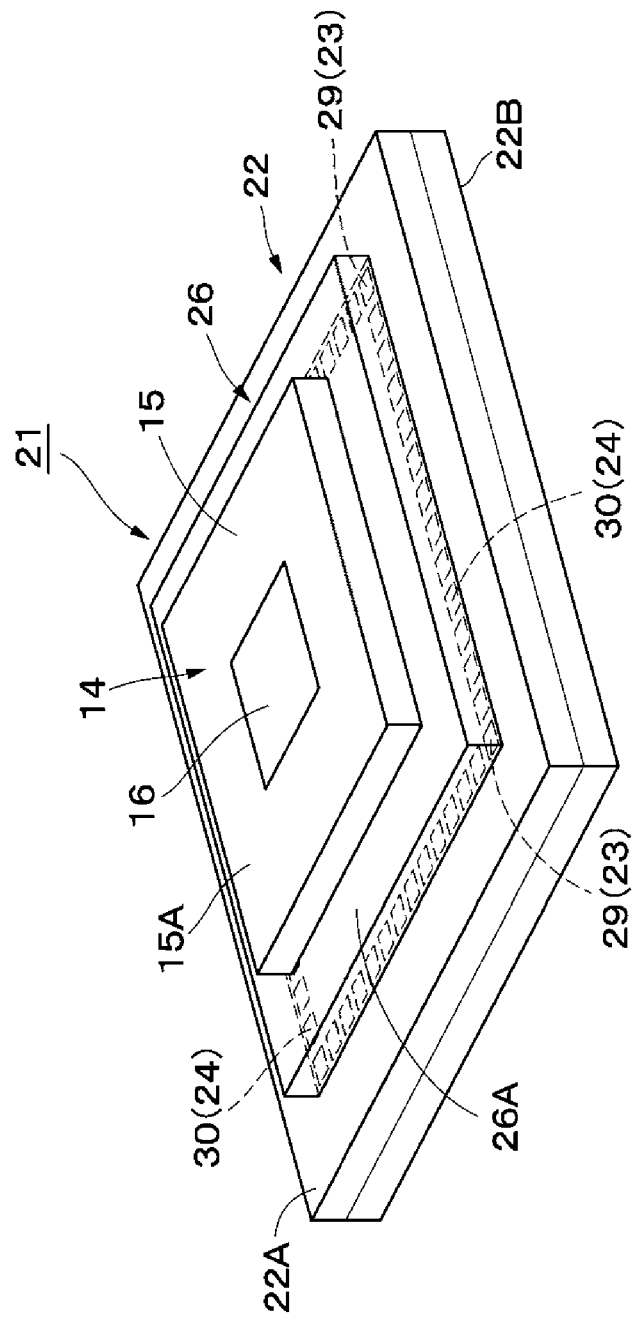
FIG. 5 is a perspective view of a high-frequency module according to a second exemplary embodiment.
Figure 6:
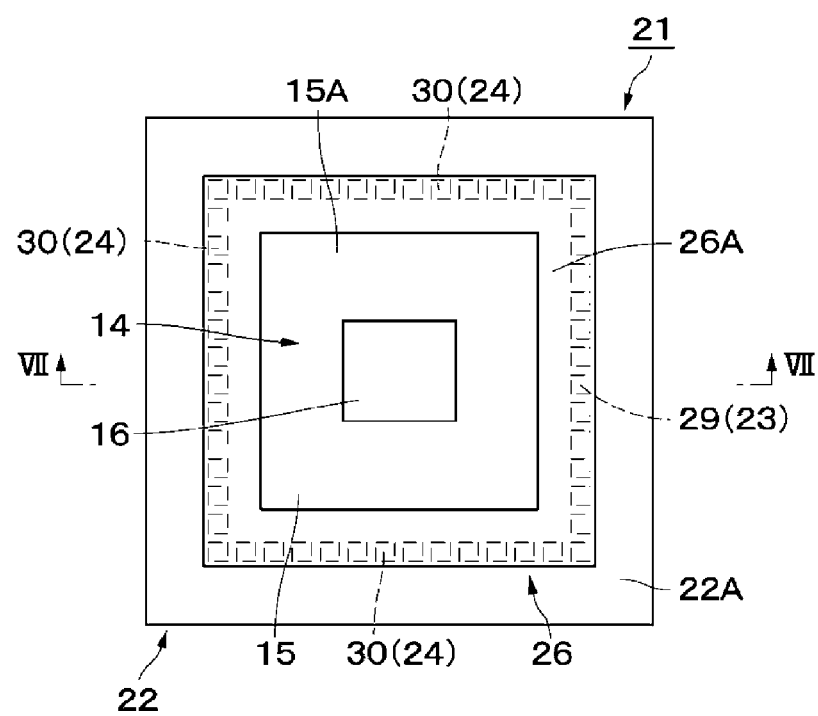
FIG. 6 is a plan view of the high-frequency module illustrated in FIG. 5.
Figure 7:
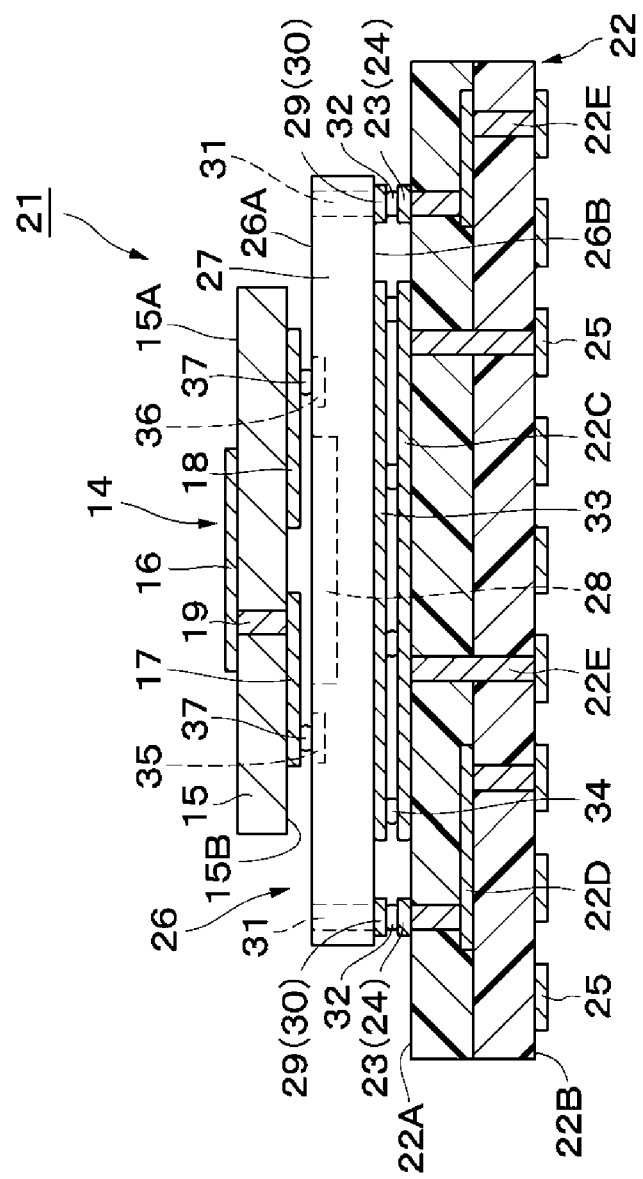
FIG. 7 is a cross-sectional view of the high-frequency module, as viewed in the direction of arrow VII-VII of FIG. 6.

FIG. 5 to FIG. 7 illustrate a second exemplary embodiment of the present disclosure. The present embodiment is characterized in that device-side direct-current voltage terminals and device-side baseband signal terminals of a semiconductor component and substrate-side direct-current voltage terminals and substrate-side baseband signal terminals of a package substrate are electrically connected to each other through bumps. Note, in the present embodiment, that the same components as those in the first embodiment are denoted by the same reference numerals, and their description will not be repeated here.

A high-frequency module 21 includes a package substrate 22, a semiconductor component 26, and the antenna 14 similarly to the high-frequency module 1 of the first embodiment.

Similarly to the package substrate 2 of the first embodiment, the package substrate 22 is formed using a multilayer substrate or the like into a substantially rectangular shape, and has a front side 22A and a back side 22B. The front side 22A of the package substrate 22 is provided with a mounting electrode 22C in the center thereof. The mounting electrode 22C is surrounded by a plurality of substrate-side direct-current voltage terminals 23 and substrate-side baseband signal terminals 24. The substrate-side direct-current voltage terminals 23 and the substrate-side baseband signal terminals 24 are disposed to face the semiconductor component 26. This means that when the semiconductor component 26 is mounted, the substrate-side direct-current voltage terminals 23 and the substrate-side baseband signal terminals 24 are covered by the semiconductor component 26.

The package substrate 22 has a plurality of external connection terminals 25 on the back side 22B. The external connection terminals 25 are electrically connected, through a wiring pattern 22D and vias 22E inside the package substrate 22, to the mounting electrode 22C, the substrate-side direct-current voltage terminals 23, and the substrate-side baseband signal terminals 24.

The semiconductor component 26 is configured similarly to the semiconductor component 6 of the first embodiment. The semiconductor component 26 includes a main body 27 and a functional circuit unit 28 and has a front side 26A and a back side 26B. The main body 27 has a plurality of device-side direct-current voltage terminals 29 and device-side baseband signal terminals 30 on the back side 26B. The device-side direct-current voltage terminals 29 and the device-side baseband signal terminals 30 are located at an outer edge of the back side 26B. The main body 27 has through vias 31 that pass therethrough in the thickness direction thereof. The device-side direct-current voltage terminals 29 and the device-side baseband signal terminals 30 are electrically connected through the through vias 31 to the functional circuit unit 28 on a side of the main body 27 adjacent to the front side 26A.

The device-side direct-current voltage terminals 29 and the device-side baseband signal terminals 30 of the semiconductor component 26 are disposed to face the substrate-side direct-current voltage terminals 23 and the substrate-side baseband signal terminals 24 of the package substrate 22. The device-side direct-current voltage terminals 29 and the device-side baseband signal terminals 30 of the semiconductor component 26 are electrically connected to the substrate-side direct-current voltage terminals 23 and the substrate-side baseband signal terminals 24 of the package substrate 22 through bumps 32 made of conductive metal, such as solder.

The back side 26B of the semiconductor component 26 is provided with a bonding electrode 33 in the center thereof. The bonding electrode 33 faces the mounting electrode 22C of the package substrate 22. The bonding electrode 33 and the mounting electrode 22C are bonded to each other through bumps 34. Thus, the semiconductor component 26 is flip-chip mounted on the front side 22A of the package substrate 22.

A device-side high-frequency signal terminal 35 and a ground terminal 36 are disposed on a side of the main body 27 adjacent to the front side 26A. The device-side high-frequency signal terminal 35 and the ground terminal 36 are positioned to face the antenna 14. The antenna substrate 15 is flip-chip mounted on the side of the main body 27 adjacent to the front side 26A. The antenna-side high-frequency signal terminal 17 and the device-side high-frequency signal terminal 35 are electrically connected to each other through a bump 37, and the ground electrode 18 and the ground terminal 36 are electrically connected to each other through another bump 37.

With the high-frequency module 21 of the present embodiment configured as described above, it is possible to achieve an operational effect substantially the same as that of the first embodiment. In particular, in the present embodiment, the device-side direct-current voltage terminals 29 and the device-side baseband signal terminals 30 of the semiconductor component 26 and the substrate-side direct-current voltage terminals 23 and the substrate-side baseband signal terminals 24 of the package substrate 22 are electrically connected to each other through the bumps 32. Therefore, unlike in the case of connection through bonding wires, the device-side direct-current voltage terminals 29 and the device-side baseband signal terminals 30 on the package substrate 22 do not have to be located at positions different from that of the semiconductor component 26, and can be located at positions facing the semiconductor component 26. This can reduce the size of the package substrate 22 and the overall size of the high-frequency module 21.

Figure 8:
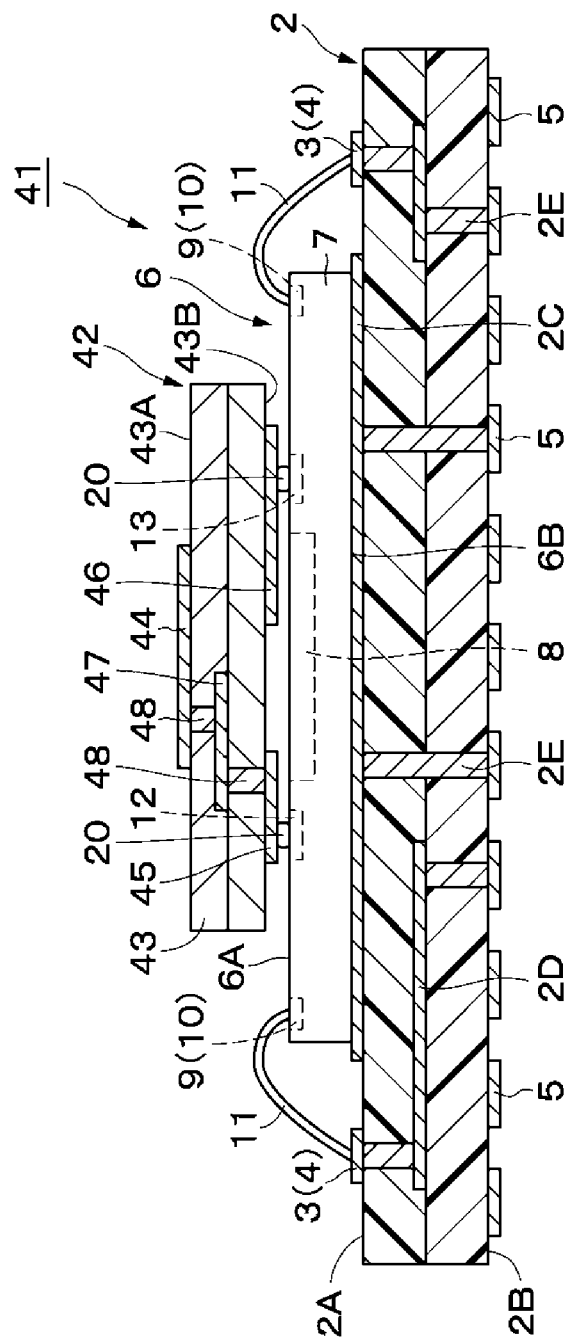
FIG. 8 is a cross-sectional view of a high-frequency module according to a third exemplary embodiment, as viewed in the same direction as FIG. 3.
Figure 9:
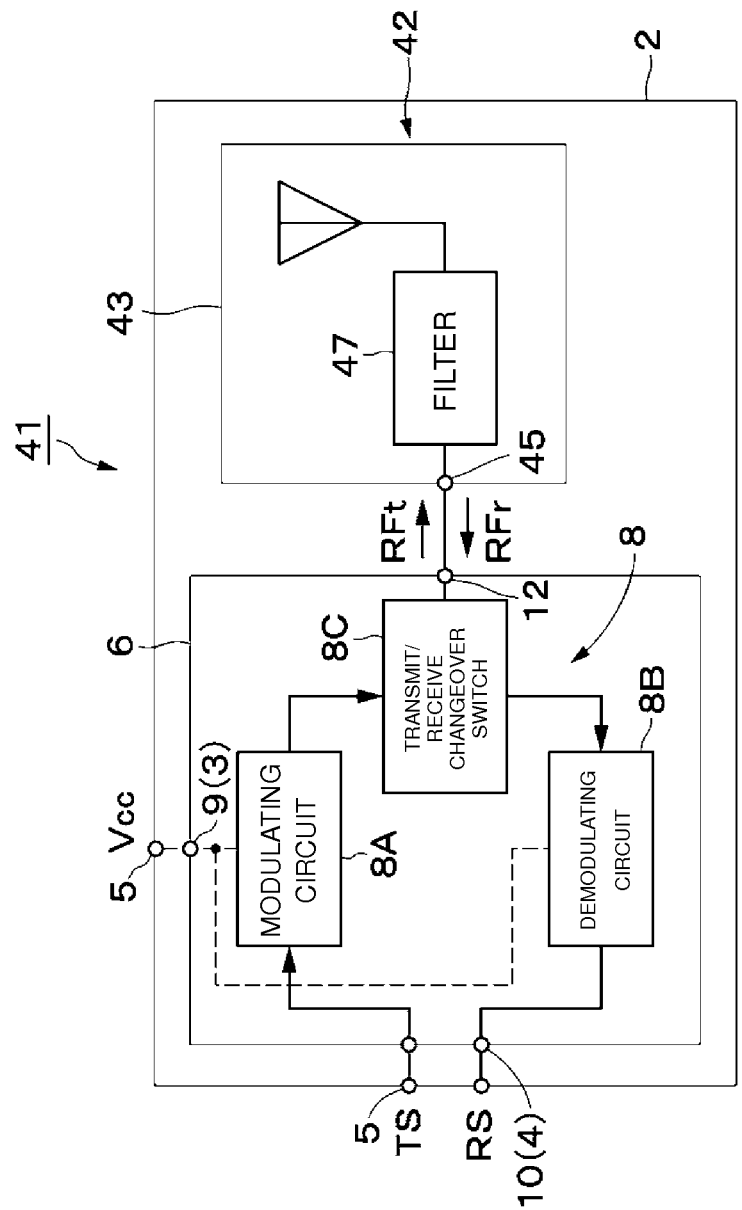
FIG. 9 is a block diagram of the high-frequency module illustrated in FIG. 8.

FIG. 8 and FIG. 9 illustrate a third exemplary embodiment of the present disclosure. The present embodiment is characterized in that an antenna substrate includes a filter electrically connected between an antenna element and an antenna-side high-frequency signal terminal. Note, in the present embodiment, that the same components as those in the first embodiment are denoted by the same reference numerals and their description will not be repeated here.

A high-frequency module 41 includes the package substrate 2, the semiconductor component 6, and an antenna 42 similarly to the high-frequency module 1 of the first embodiment.

Similarly to the antenna 14 of the first embodiment, the antenna 42 includes an antenna substrate 43 and an antenna element 44 formed, for example, by an electrode pattern on the antenna substrate 43. The antenna element 44 is disposed on a front side 43A of the antenna substrate 43. An antenna-side high-frequency signal terminal 45 and a ground electrode 46 are disposed on a back side 43B of the antenna substrate 43.

The antenna substrate 43 is formed, for example, by a multilayer substrate produced by stacking insulating layers made of a dielectric material. A filter 47 serving as a passive circuit portion is disposed inside the antenna substrate 43. The filter 47 is formed, for example, by an electrode pattern produced by forming a conductive metal thin film. The filter 47 forms a bandpass filter that passes high-frequency signals RFt and RFr and blocks the other signals depending on its shape. The filter 47 is connected through vias 48 to the antenna element 44 and to the antenna-side high-frequency signal terminal 45.

The filter 47 may be a diplexer having different frequency passbands for transmission and reception. The antenna substrate 43 may be provided with two or more antenna-side high-frequency signal terminals 45 connected to the single antenna element 44, and may include a plurality of filters 47 corresponding to the respective antenna-side high-frequency signal terminals 45.

The antenna substrate 43 is flip-chip mounted on the front side 6A of the semiconductor component 6, with the antenna-side high-frequency signal terminal 45 and the device-side high-frequency signal terminal 12 facing each other. The antenna-side high-frequency signal terminal 45 and the device-side high-frequency signal terminal 12 are electrically connected to each other through a bump 20, and the ground electrode 46 and the ground terminal 13 are electrically connected to each other through another bump 20.

With the high-frequency module 41 of the present embodiment configured as described above, it is possible to achieve an operational effect substantially the same as that of the first embodiment. In particular, since the antenna substrate 43 includes the filter 47 in the present embodiment, high-frequency signals RFt and RFr can be processed inside the antenna substrate 43. This makes it possible to eliminate signals in unwanted frequency bands without causing an increase in material cost.

Although the filter 47 is disposed inside the antenna substrate 43 in the third exemplary embodiment, the filter 47 may be disposed, for example, on the front side 43A or back side 43B of the antenna substrate 43. In this case, it is not necessary to use a multilayer substrate to form the antenna substrate 43. As in the case of the antenna substrate 15 of the first embodiment, a single-layer dielectric substrate may be used to form the antenna substrate 43.

Although, in the third embodiment, the characterized portion is applied to the first embodiment as an example, the characterized portion may be applied to the second embodiment.

Figure 10:
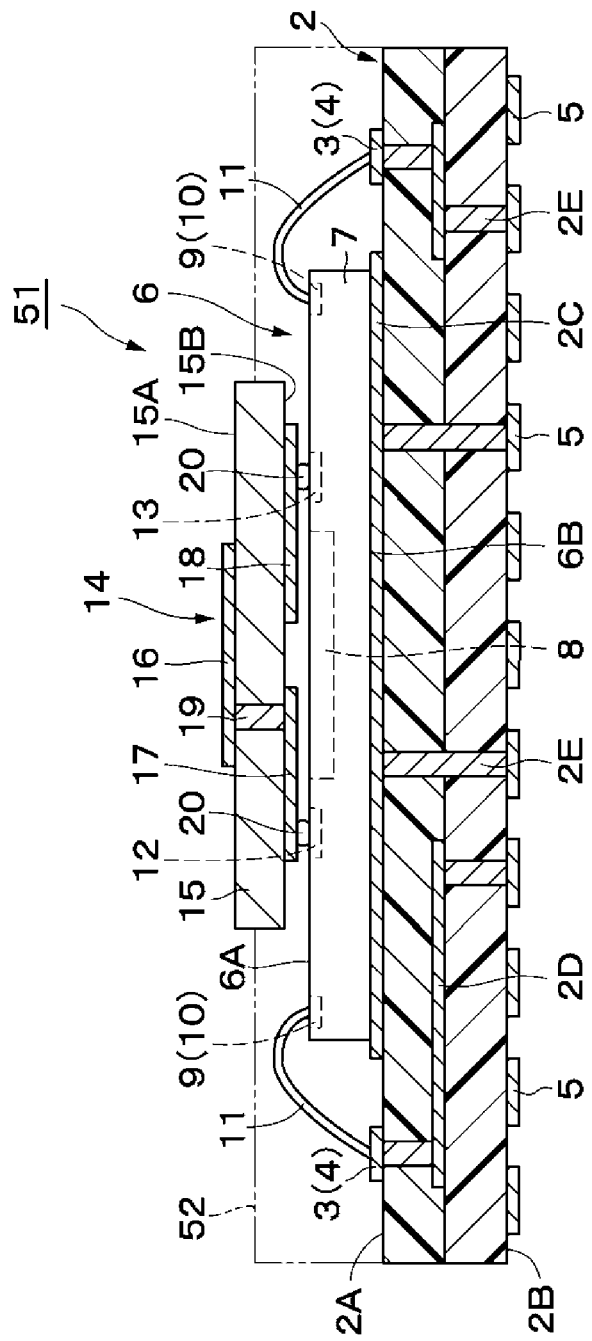
FIG. 10 is a cross-sectional view of a high-frequency module according to a fourth exemplary embodiment, as viewed in the same direction as FIG. 3.

FIG. 10 illustrates a fourth exemplary embodiment of the present disclosure. The present embodiment is characterized in that the front side of the package substrate is sealed with a resin material that covers the semiconductor component. Note, in the present embodiment, that the same components as those in the first embodiment are denoted by the same reference numerals and their description will not be repeated here.

A high-frequency module 51 includes the package substrate 2, the semiconductor component 6, and the antenna 14 similarly to the high-frequency module 1 of the first embodiment.

In the present embodiment, however, the front side 2A of the package substrate 2 is provided with a sealing member 52 made of an insulating resin material that covers the semiconductor component 6. The sealing member 52 seals the connecting portions, including the bonding wires 11, between the substrate-side direct-current voltage terminals 3 and the substrate-side baseband signal terminals 4 of the package substrate 2, and the device-side direct-current voltage terminals 9 and the device-side baseband signal terminals 10 of the semiconductor component 6. At the same time, the sealing member 52 seals the connecting portions, including the bumps 20, between the device-side high-frequency signal terminal 12 and the ground terminal 13 of the semiconductor component 6, and the antenna-side high-frequency signal terminal 17 and the ground electrode 18 of the antenna substrate 15.

With the high-frequency module 51 of the present embodiment configured as described above, it is possible to achieve an operational effect substantially the same as that of the first embodiment. In particular, in the present embodiment, the front side 2A of the package substrate 2 is sealed with the sealing member 52 made of a resin material that covers the semiconductor component 6. Thus, the connecting portions between the substrate-side direct-current voltage terminals 3 and the substrate-side baseband signal terminals 4 of the package substrate 2, and the device-side direct-current voltage terminals 9 and the device-side baseband signal terminals 10 of the semiconductor component 6 can be sealed with the sealing member 52. At the same time, the connecting portion between the device-side high-frequency signal terminal 12 of the semiconductor component 6 and the antenna-side high-frequency signal terminal 17 of the antenna substrate 15 can also be sealed with the sealing member 52. In the manufacturing process, these connecting portions can be easily sealed together. The manufacturing process can thus be simplified, as compared to the case where the connecting portions are sealed individually.

Figure 11:
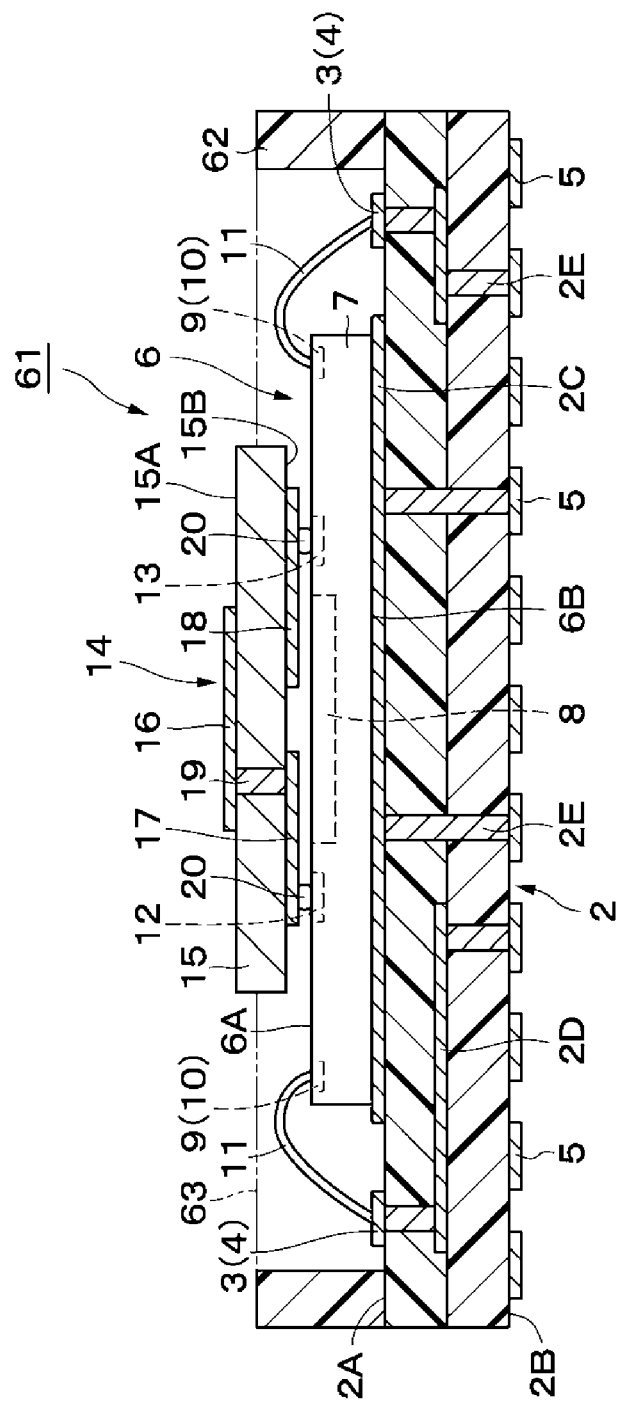
FIG. 11 is a cross-sectional view of a high-frequency module according to a modification, as viewed in the same direction as FIG. 3.

In the fourth exemplary embodiment described above, the front side 2A of the package substrate 2 having a planar shape is provided with the sealing member 52. However, the present invention is not limited to this. For example, like a high-frequency module 61 according to a modification illustrated in FIG. 11, the front side 2A of the package substrate 2 may be provided with a frame 62 that covers an outer edge of the package substrate 2. In this case, the semiconductor component 6 disposed inside the frame 62 is covered with a sealing member 63. Since the frame 62 can form a cavity, the semiconductor component 6 and the antenna 14 disposed inside the cavity can be sealed by placing the sealing member 63 made of a resin material in the cavity. The sealing process can thus be simplified.

Although, in the fourth embodiment, the characterized portion is applied to the first embodiment as an example, the characterized portion may be applied to the second or third embodiment.

Figure 12:
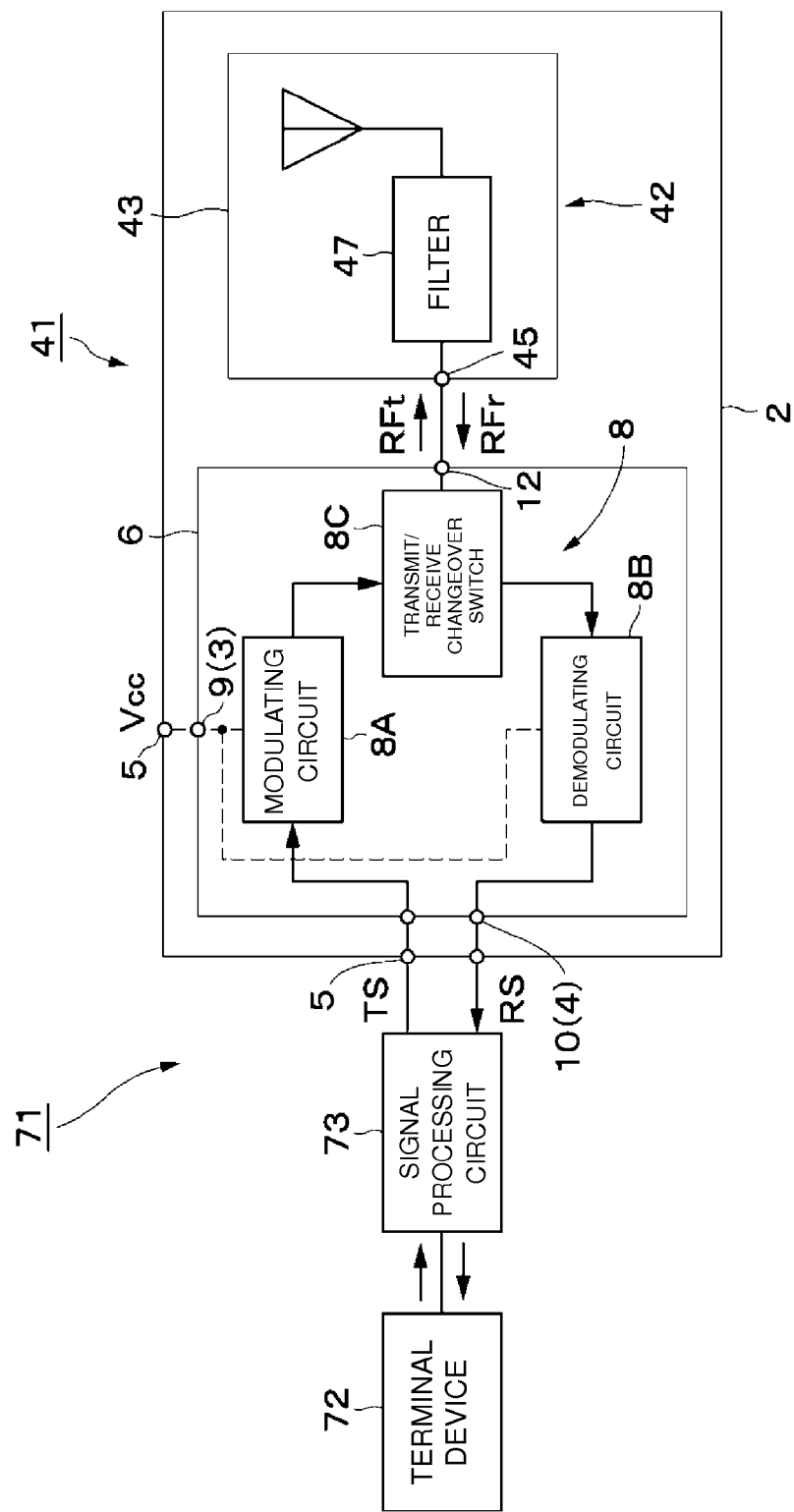
FIG. 12 is a block diagram of a communication apparatus according to a fifth exemplary embodiment.

FIG. 12 illustrates a fifth exemplary embodiment of the present disclosure. The present embodiment is characterized in that a communication apparatus includes a high-frequency module.

A communication apparatus 71 includes a terminal device 72 configured to input or output voice, data or the like, a signal processing circuit 73 connected to the terminal device 72 and configured to process baseband signals TS and RS, and, for example, the high-frequency module 41 of the third embodiment. The signal processing circuit 73 is disposed, for example, on a motherboard (not shown), whose connection terminals are connected to the external connection terminals 5 of the high-frequency module 41. This allows the signal processing circuit 73 to be electrically connected to the semiconductor component 6 of the high-frequency module 41.

In transmitting mode, the signal processing circuit 73 generates a baseband signal TS from information input from the terminal device 72, and outputs the baseband signal TS to the modulating circuit 8A. The modulating circuit 8A converts the baseband signal TS into a high-frequency signal RFt, which passes through the transmit/receive changeover switch 8C and is transmitted from the antenna 42.

In receiving mode, a high-frequency signal RFr received from the antenna 42 passes through the transmit/receive changeover switch 8C and is input to the demodulating circuit 8B of the semiconductor component 6. The demodulating circuit 8B demodulates the high-frequency signal RFr into a baseband signal RS, and outputs the baseband signal RS through the external connection terminals 5 to the signal processing circuit 73 outside the high-frequency module 41. From the baseband signal RS, the signal processing circuit 73 generates information, such as voice and images, and outputs the generated information to the terminal device 72.

In the present embodiment, where the communication apparatus 71 includes the high-frequency module 41, it is possible to reduce the overall cost of manufacturing the communication apparatus 71. Because the small size high-frequency module 41 can be used, the communication apparatus 71 can be easily mounted on a small size apparatus, such as a mobile phone.

Although the high-frequency module 41 of the third embodiment is used in the fifth embodiment, any one of the high-frequency modules 1, 21, 51, and 61 of the first, second, and fourth embodiments may be used instead.

In the exemplary embodiments described above, a multilayer substrate including a plurality of insulating layers is used to form the package substrates 2 and 22. However, a single-layer dielectric substrate may be used to form the package substrates 2 and 22.

In the exemplary embodiments described above, the functional circuit units 8 and 28 of the semiconductor components 6 and 26 each include both the modulating circuit 8A and the demodulating circuit 8B. However, the functional circuit units 8 and 28 each may be configured to include only one of the modulating circuit 8A and the demodulating circuit 8B.

In the exemplary embodiments described above, the antenna substrates 15 and 43 are provided with the antenna elements 16 and 44, respectively. However, each antenna substrate may be provided with, for example, two different antenna elements for use in transmission and reception.

In the exemplary embodiments described above, the semiconductor components 6 and 26 each are provided with the single antenna 14 or 42. However, each semiconductor component may be provided with, for example, two different antennas for use in transmission and reception. Each semiconductor component may be provided with a plurality of antennas whose respective antenna elements use independent channels or the same channel.

In embodiments consistent with the present disclosure, the antenna substrate is provided separately from the package substrate having the substrate-side direct-current voltage terminals, the substrate-side baseband signal terminals, and the external connection terminals. Therefore, it is only necessary that the antenna substrate for propagation of high-frequency signals be made using a material with good high-frequency characteristics. Since the package substrate can be made using an inexpensive resin material or the like, it is possible to reduce the cost of manufacture.

Additionally, the semiconductor component is face-up mounted on the package substrate, and the antenna substrate is flip-chip mounted on the front side of the semiconductor component. The antenna-side high-frequency signal terminal and the device-side high-frequency signal terminal can thus be electrically connected to each other through a bump. Therefore, for example, as compared to the case where the semiconductor component and the antenna substrate are electrically connected to each other through bonding wires, the line length of the connecting portions can be shortened. Since the length of transmission lines for high-frequency signals between the semiconductor component and the antenna substrate can be minimized, it is possible to reduce the transmission loss of high-frequency signals and suppress the entry of external noise into high-frequency signals.

In embodiments in which the device-side direct-current voltage terminals and the device-side baseband signal terminals of the semiconductor component and the substrate-side direct-current voltage terminals and the substrate-side baseband signal terminals of the package substrate are electrically connected to each other through bonding wires, even when the functional circuit unit, the device-side direct-current voltage terminals, and the device-side baseband signal terminals are disposed on the front side of the semiconductor component, the device-side direct-current voltage terminals and the device-side baseband signal terminals can be easily connected to the substrate-side direct-current voltage terminals and the substrate-side baseband signal terminals of the package substrate, and the connecting state of each of the terminals can be visually checked easily.

In embodiments in which the semiconductor component has vias extending from the front side where the functional circuit unit is located to the back side, the device-side direct-current voltage terminals and the device-side baseband signal terminals of the semiconductor component are located on the back side of the semiconductor component and electrically connected through the vias to the functional circuit unit, and the device-side direct-current voltage terminals and the device-side baseband signal terminals of the semiconductor component and the substrate-side direct-current voltage terminals and the substrate-side baseband signal terminals of the package substrate are electrically connected to each other through bumps, unlike in the case of connection through bonding wires, the device-side direct-current voltage terminals and the device-side baseband signal terminals on the package substrate do not have to be located at positions different from that of the semiconductor component, and can be located at positions facing the semiconductor component. This can reduce the size of the package substrate and the overall size of the high-frequency module.

In embodiments in which the antenna substrate includes a passive circuit portion electrically connected between the antenna element and the antenna-side high-frequency signal terminal and configured to process high-frequency signals, the antenna substrate includes the passive circuit portion electrically connected between the antenna element and the antenna-side high-frequency signal terminal and configured to process high-frequency signals, high-frequency signals can be processed inside the antenna substrate.

In embodiments consistent with the present disclosure having the front side of the package substrate sealed with a resin material that covers the semiconductor component, the connecting portions between the substrate-side direct-current voltage terminals and the substrate-side baseband signal terminals of the package substrate and the device-side direct-current voltage terminals and the device-side baseband signal terminals of the semiconductor component can be sealed with the resin material. At the same, since the device-side high-frequency signal terminal and the antenna-side high-frequency signal terminal are connected to each other on the front side of the semiconductor component, their connecting portion can also be sealed together. Thus, in the manufacturing process, these connecting portions can be easily sealed together.

In embodiments in which a communication apparatus includes any of the above high-frequency modules, the cost of manufacturing the entire communication apparatus can be reduced.

That which is claimed is:

1. A high-frequency module comprising:
   a package substrate formed of a dielectric material, the package substrate having substrate-side direct-current voltage terminals configured to output a direct-current voltage, substrate-side baseband signal terminals configured to input or output baseband signals, and external connection terminals for connection to an external circuit;
   a semiconductor component including a functional circuit unit having at least one of a function of modulating a baseband signal into a high-frequency signal and a function of demodulating a high-frequency signal into a baseband signal, device-side direct-current voltage terminals to which a direct-current voltage for driving is input, device-side baseband signal terminals configured to input or output baseband signals, and a device-side high-frequency signal terminal located on the same front side of the semiconductor component as the functional circuit unit and configured to input or output high-frequency signals; and
   an antenna substrate formed using a dielectric material, the antenna substrate having an antenna element on a front side thereof and an antenna-side high-frequency signal terminal on a back side thereof, the antenna-side high-frequency signal terminal being configured to input or output high-frequency signals,
   wherein the semiconductor component is face-up mounted on the package substrate with a back side thereof facing the package substrate, and the device-side direct-current voltage terminals and the device-side baseband signal terminals are electrically connected to the substrate-side direct-current voltage terminals and the substrate-side baseband signal terminals, respectively; and the antenna substrate is flip-chip mounted on the front side of the semiconductor component, and the antenna-side high-frequency signal terminal is electrically connected to the device-side high-frequency signal terminal on the front side of the semiconductor component.

2. The high-frequency module according to claim 1, wherein the device-side direct-current voltage terminals and the device-side baseband signal terminals of the semiconductor component and the substrate-side direct-current voltage terminals and the substrate-side baseband signal terminals of the package substrate are electrically connected to each other through bonding wires.

3. The high-frequency module according to claim 1, wherein the semiconductor component has vias extending from the front side where the functional circuit unit is located to the back side;

the device-side direct-current voltage terminals and the device-side baseband signal terminals of the semiconductor component are located on the back side of the semiconductor component and electrically connected through the vias to the functional circuit unit; and the device-side direct-current voltage terminals and the device-side baseband signal terminals of the semiconductor component and the substrate-side direct-current voltage terminals and the substrate-side baseband signal terminals of the package substrate are electrically connected to each other through bumps.

4. The high-frequency module according to claim 1, wherein the antenna substrate includes a passive circuit portion electrically connected between the antenna element and the antenna-side high-frequency signal terminal and configured to process high-frequency signals.

5. The high-frequency module according to claim 2, wherein the antenna substrate includes a passive circuit portion electrically connected between the antenna element and the antenna-side high-frequency signal terminal and configured to process high-frequency signals.

6. The high-frequency module according to claim 3, wherein the antenna substrate includes a passive circuit portion electrically connected between the antenna element and the antenna-side high-frequency signal terminal and configured to process high-frequency signals.

7. The high-frequency module according to claim 1, wherein the antenna element is configured to transmit or receive high-frequency signals in a microwave band or a millimeter wave band.

8. The high-frequency module according to claim 2, wherein the antenna element is configured to transmit or receive high-frequency signals in a microwave band or a millimeter wave band.

9. The high-frequency module according to claim 3, wherein the antenna element is configured to transmit or receive high-frequency signals in a microwave band or a millimeter wave band.

10. The high-frequency module according to claim 1, wherein the front side of the package substrate is sealed with a resin material that covers the semiconductor component.

11. The high-frequency module according to claim 2, wherein the front side of the package substrate is sealed with a resin material that covers the semiconductor component.

12. The high-frequency module according to claim 3, wherein the front side of the package substrate is sealed with a resin material that covers the semiconductor component.

13. A communication apparatus comprising a high-frequency module according to claim 1.

14. A communication apparatus comprising a high-frequency module according to claim 2.

15. A communication apparatus comprising a high-frequency module according to claim 3.

* * * * *